United States Patent
Yu et al.

(10) Patent No.: US 8,830,715 B2
(45) Date of Patent: Sep. 9, 2014

(54) SEMICONDUCTOR MEMORY DEVICE INCLUDING VERTICAL CHANNEL TRANSISTORS

(75) Inventors: Hak-Soo Yu, Seongnam-si (KR); Su-A Kim, Seongnam-si (KR); Hong-Sun Hwang, Suwon-si (KR); Chul-Woo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 402 days.

(21) Appl. No.: 13/304,851

(22) Filed: Nov. 28, 2011

(65) Prior Publication Data
US 2012/0212989 A1 Aug. 23, 2012

(30) Foreign Application Priority Data
Feb. 18, 2011 (KR) .................. 10-2011-0014766

(51) Int. Cl.
| | | |
|---|---|---|
| *G11C 5/02* | (2006.01) | |
| *G11C 11/34* | (2006.01) | |
| *H01L 27/108* | (2006.01) | |
| *G11C 7/02* | (2006.01) | |
| *G11C 7/06* | (2006.01) | |

(52) U.S. Cl.
CPC ............ *G11C 7/02* (2013.01); *H01L 27/10897* (2013.01); *H01L 27/10891* (2013.01); *H01L 27/10885* (2013.01); *H01L 27/10882* (2013.01); *G11C 7/062* (2013.01)
USPC ........................................ 365/51; 365/185.12

(58) Field of Classification Search
USPC .......... 365/185.12, 185.13, 207, 202, 190, 51
See application file for complete search history.

(56) References Cited

U.S. PATENT DOCUMENTS

| | | | |
|---|---|---|---|
| 6,440,801 | B1 | 8/2002 | Furukawa et al. |
| 6,680,501 | B2 | 1/2004 | Ito et al. |
| 2002/0134997 | A1 * | 9/2002 | Ito et al. .................... 257/210 |
| 2006/0003525 | A1 | 1/2006 | Noble et al. |
| 2007/0008767 | A1 * | 1/2007 | Murakami et al. ............ 365/145 |
| 2007/0278554 | A1 * | 12/2007 | Song et al. .................... 257/314 |
| 2008/0048239 | A1 * | 2/2008 | Huo et al. .................... 257/315 |
| 2010/0172182 | A1 * | 7/2010 | Seol et al. ................ 365/185.17 |
| 2010/0200906 | A1 * | 8/2010 | Kidoh et al. .................. 257/324 |
| 2011/0306199 | A1 * | 12/2011 | Nojiri et al. .................. 438/618 |
| 2012/0182803 | A1 * | 7/2012 | Shirakawa ............... 365/185.11 |

FOREIGN PATENT DOCUMENTS

KR     10-2010-0001854 A     1/2010

* cited by examiner

*Primary Examiner* — Vanthu Nguyen
*Assistant Examiner* — Khamdan Alrobaie
(74) *Attorney, Agent, or Firm* — Muir Patent Consulting, PLLC (57) ABSTRACT

A semiconductor memory device is disclosed. The semiconductor memory device includes a memory array block, a first word line and a second word line. The memory array block includes a plurality of adjacent columns of memory cells, each column of memory cells including a plurality of consecutive memory cells having a plurality of respective consecutive cell transistors that comprise at least a first group of cell transistors and a second group of cell transistors. The first word line is disposed above the plurality of respective consecutive cell transistors and electrically connected to the first group of cell transistors, and the second word line is disposed below the plurality of respective consecutive cell transistors and electrically connected to the second group of cell transistors.

18 Claims, 6 Drawing Sheets

SEMICONDUCTOR MEMORY DEVICE INCLUDING VERTICAL CHANNEL TRANSISTORS

CROSS-REFERENCE TO RELATED APPLICATION

This application claims priority under 35 U.S.C. §119 to Korean Patent Application No. 10-2011-0014766 filed on Feb. 18, 2011, the disclosure of which is hereby incorporated by reference in its entirety.

BACKGROUND

1. Field

Embodiments of the inventive concept relate to a memory core and a semiconductor memory device including the memory core.

2. Description of Related Art

Memory core structures of semiconductor memory devices include an open bit-line structure and a folded bit-line structure. In a conventional open bit-line structure, a dummy bit-line and an edge block are present, and noise may be generated from a source other than a common noise source. Thus, a semiconductor memory device having the conventional open bit-line structure has a large chip size and poor noise characteristics.

SUMMARY

Embodiments of the disclosure provide a memory core that occupies a small area in an integrated circuit (IC) and can improve noise characteristics.

Embodiments of the disclosure also provide a semiconductor memory device including the memory core.

According to one example embodiment, a semiconductor memory device includes a first memory array block and a bit-line sense amplifier. The first memory array block includes a first set of memory cells electrically connected to a first bit line extending in a first direction; a second set of memory cells electrically connected to a second bit line extending in the first direction and adjacent to the first bit line; a first word line electrically connected to a first memory cell of the first set of memory cells and extending in a second direction different from the first direction; and a second word line electrically connected to a first memory cell of the second set of memory cells and extending in the second direction, wherein each of first memory cells includes a respective first cell transistor having an upper active node, a lower active node and a gate node disposed between the upper active node and the lower active node, wherein the gate node includes top surface and bottom surface, and wherein the first word line is disposed above the top surface of the gate node of each of the first cell transistors and the second word line is disposed below the bottom surface of the gate node of each of the first cell transistors. The bit-line sense amplifier is configured to amplify a voltage difference between the first bit line and second bit line.

According to another example embodiment, a semiconductor memory device includes a first memory array block, a second memory array block, and a bit-line sense amplifier. The first memory array block includes a first plurality of rows and columns including memory cells having first cell transistors, each column of the first plurality of columns including a first word line arranged above upper portions of the first cell transistors, and a second word line arranged below lower portions of the first cell transistors, wherein the first plurality of rows include a first bit line and a complementary first bit line. The second memory array block includes a second plurality of rows and columns including memory cells having second cell transistors, each column of the second plurality of columns including a third word line arranged above upper portions of the second cell transistors, and a fourth word line arranged below lower portions of the second cell transistors, wherein the second plurality of rows include a second bit line and a complementary second bit line. The bit-line sense amplifier is configured to amplify a voltage difference between the first bit line and the complementary first bit line arranged in the first memory array block, and a voltage difference between the second bit line and the complementary second bit line arranged in the second memory array block. Each crossing of the first word line with a bit line in the first memory array block coincides with a first cell transistor, and each crossing of the second word line with a bit line in the second memory array block coincides with a second cell transistor.

According to further example embodiment, a semiconductor memory device includes memory array block, a first word line, and a second word line. The memory array block includes a plurality of adjacent columns of memory cells, each column of memory cells including a plurality of consecutive memory cells having a plurality of respective consecutive cell transistors that comprise at least a first group of cell transistors and a second group of cell transistors. The first word line is disposed above the plurality of respective consecutive cell transistors and electrically connected to the first group of cell transistors. The second word line is disposed below the plurality of respective consecutive cell transistors and electrically connected to the second group of cell transistors.

In some example embodiments, a semiconductor memory device includes a memory core, a local sense amplifier, an input/output (I/O) amplifier, and an I/O buffer.

The memory core amplifies a voltage difference between a bit line and a complementary bit line, and provides the amplified voltage difference to a pair of local I/O lines. The local sense amplifier amplifies a voltage signal of the pair of local I/O lines, and provides the amplified voltage signal to a pair of global I/O lines. The I/O sense amplifier amplifies a voltage signal of the pair of global I/O lines. The I/O buffer buffers and outputs the output signal of the I/O sense amplifier, or buffers input data. The memory core includes a memory array block and a bit-line sense amplifier. The memory array block includes a plurality of rows and columns including memory cells having cell transistors, and each of the plurality of columns includes a first word line arranged above upper portions of the cell transistors, and a second word line arranged below lower portions of the cell transistors. The bit-line sense amplifier amplifies a voltage difference between two neighboring bit lines arranged in the memory array block.

BRIEF DESCRIPTION OF THE DRAWINGS

Exemplary embodiments will be more clearly understood from the following detailed description taken in conjunction with the accompanying drawings.

DETAILED DESCRIPTION OF THE EMBODIMENTS

Various embodiments will now be described more fully with reference to the accompanying drawings in which some embodiments are shown. These inventive concepts may, however, be embodied in different forms and should not be construed as limited to the embodiments set forth herein.

It will be understood that when an element or layer is referred to as being "on," "connected to" or "coupled with" another element or layer, it can be directly on, connected or coupled with the other element or layer or intervening elements or layers may be present. In contrast, when an element is referred to as being "directly on," "directly connected to" or "directly coupled with" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms such as "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Hereinafter, embodiments of the disclosure will be described with reference to appended drawings.

Figure 1:
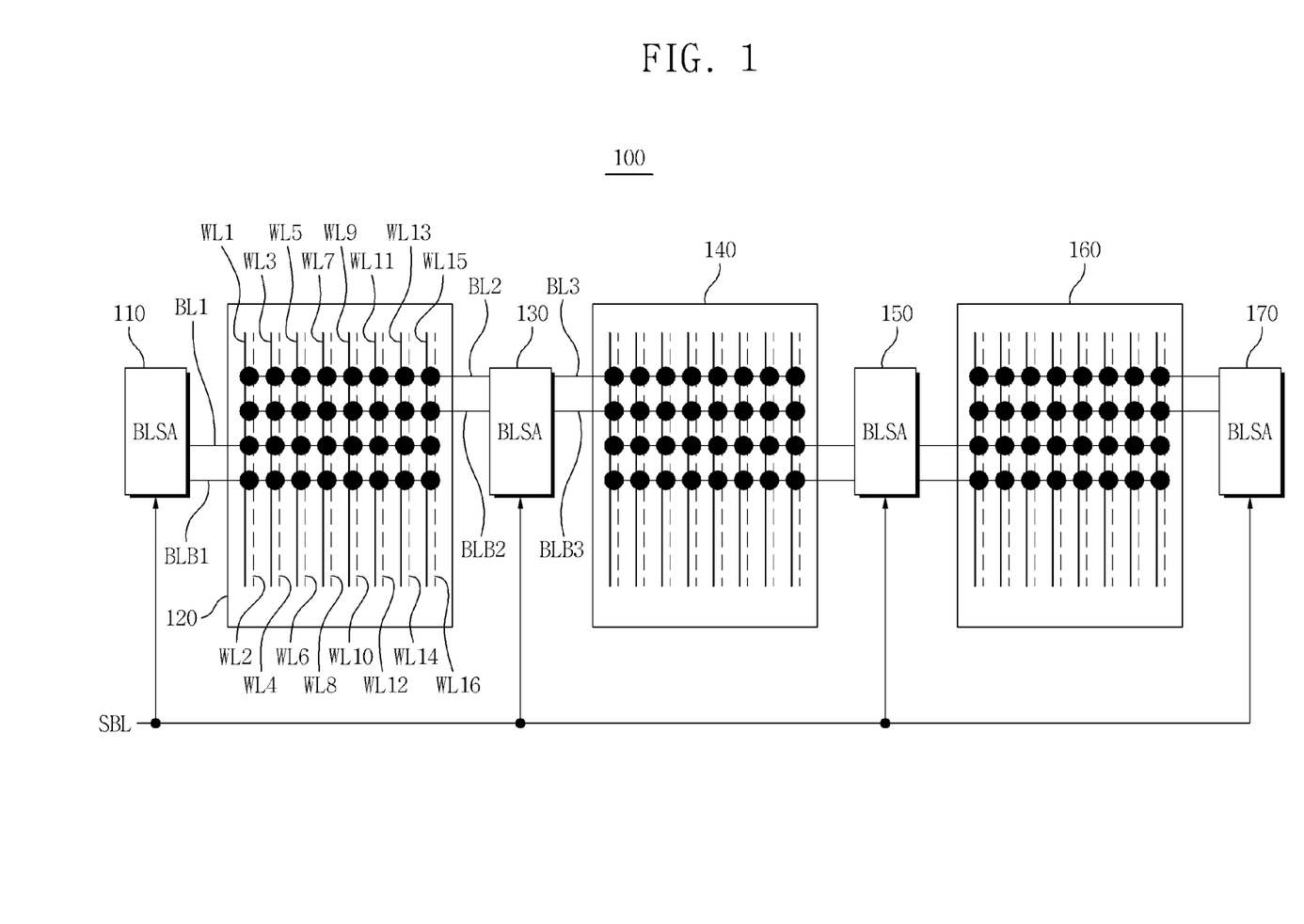
FIG. 1 is a plan view of a memory core according to example embodiments.
Figure 2:
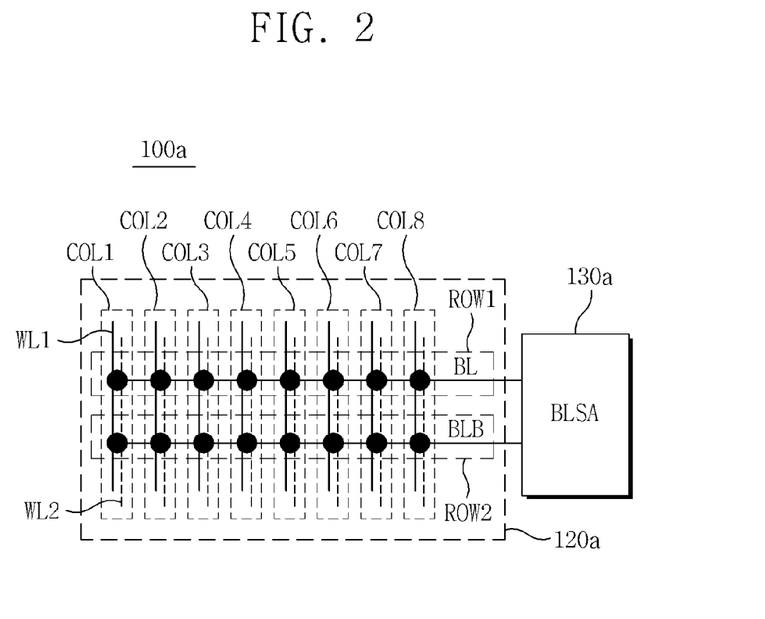
FIG. 2 is a plan view illustrating an example embodiment of a horizontal structure of the memory core of FIG. 1.

FIG. 1 is a plan view of a memory core 100 according to example embodiments, and FIG. 2 is a plan view illustrating an example embodiment of a horizontal structure of the memory core 100 of FIG. 1.

Referring to FIG. 1, the memory core 100 includes memory array blocks 120, 140 and 160, and bit-line sense amplifiers 110, 130, 150 and 170. Referring to FIG. 2, a memory core 100a includes a memory array block 120a and a bit-line sense amplifier 130a.

The memory array block 120a includes a plurality of rows ROW1 and ROW2 and columns COL1 to COL8 including memory cells having cell transistors, and each of the plurality of columns COL1 to COL8 includes a first word line WL1 disposed above the upper portions of cell transistors, and a second word line WL2 disposed below the lower portions of the cell transistors. The cell transistors may be, for example, vertical channel transistors (VCTs). The bit-line sense amplifier 130a amplifies a voltage difference between two neighboring bit lines BL and BLB arranged in the memory array block 120a. Although the rows ROW1 and ROW2 and columns COL1 and COL8 are described herein as rows and columns respectively, the rows may also be referred to as columns, and in such a case, columns may be referred to as rows.

One of the bit lines BL and BLB may be a normal bit line, and the other may be a complementary bit line. The memory array blocks described herein could be part of a DRAM, for example, but are not limited thereto, and may comprise NAND flash, NOR flash, RRAM, PRAM, MRAM etc.

In an example embodiment, the memory array block (120 of FIG. 1) may include eight columns including a plurality of memory cells. Word lines WL1 and WL2 are arranged in a first column, word lines WL3 and WL4 are arranged in a second column, word lines WL5 and WL6 are arranged in a third column, word lines WL7 and WL8 are arranged in a fourth column, word lines WL9 and WL10 are arranged in a fifth column, word lines WL11 and WL12 are arranged in a sixth column, word lines WL13 and WL14 are arranged in a seventh column, and word lines WL15 and WL16 are arranged in an eighth column.

The bit-line sense amplifier 110 accesses data from the memory array block 120 through bit lines BL1 and BLB1.

The bit-line sense amplifier 130 accesses data from the memory array block 120 through bit lines BL2 and BLB2, and accesses data from the memory array block 140 through bit lines BL3 and BLB3.

In an example embodiment, the bit-line sense amplifier 130 disposed between the memory array blocks 120 and 140, and the bit-line sense amplifier 150 disposed between the memory array blocks 140 and 160, a block selection signal SBL for selecting a memory array block to be sensed between the two coupled memory array blocks may be applied.

Figure 3:
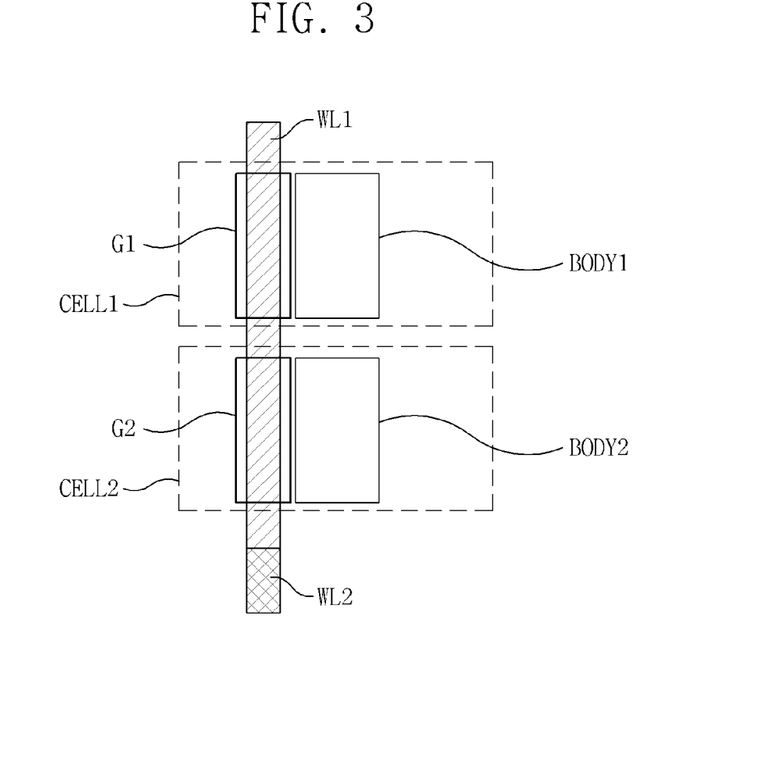
FIG. 3 is a plan view showing an example embodiment of a horizontal structure of one column of a memory array block included in the memory core of FIG. 2.
Figure 4:
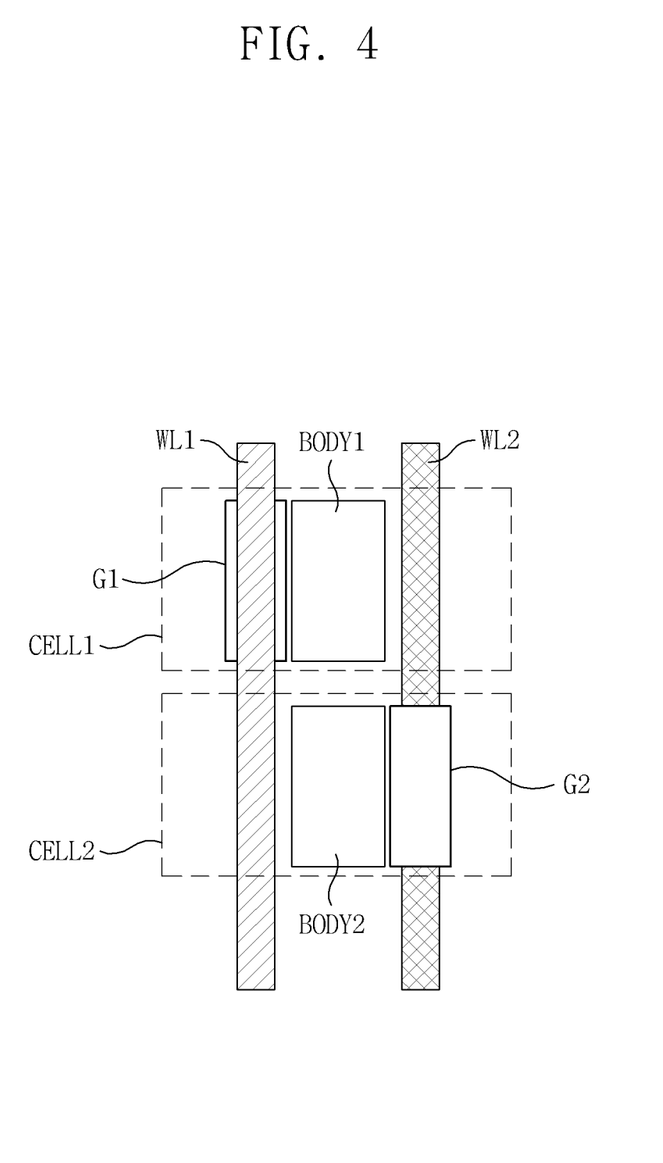
FIG. 4 is a plan view showing another example embodiment of a horizontal structure of one column of the memory array block included in the memory core of FIG. 2.

FIG. 3 is a plan view showing an example embodiment of a horizontal structure of one column of a memory array block included in the memory core of FIG. 2, and FIG. 4 is a plan view showing another example embodiment of a horizontal structure of one column of the memory array block included in the memory core of FIG. 2. In FIGS. 3 and 4, bodies BODY1 and BODY 2, gates G1 and G2, and word lines WL1 and WL2 included in memory cells CELL 1 and CELL2 are shown. For example, in the memory cell CELL1 of FIG. 3, a cell transistor includes body BODY1, an upper active node (not shown), a lower active node (not shown), and a gate G1. A shape of the body BODY1 may be a pillar type and the gate G1 may surround the body BODY1 between the upper active node and lower active node. In an example embodiment, the word line WL1 and word line WL2 are overlapped when viewed from on overhead view. In another example embodiment, as shown in FIG. 4, the word line WL1 and word line WL2 are disposed separately adjacent to bodies BODY1 and BODY2 when viewed from on overhead view.

Figure 5:
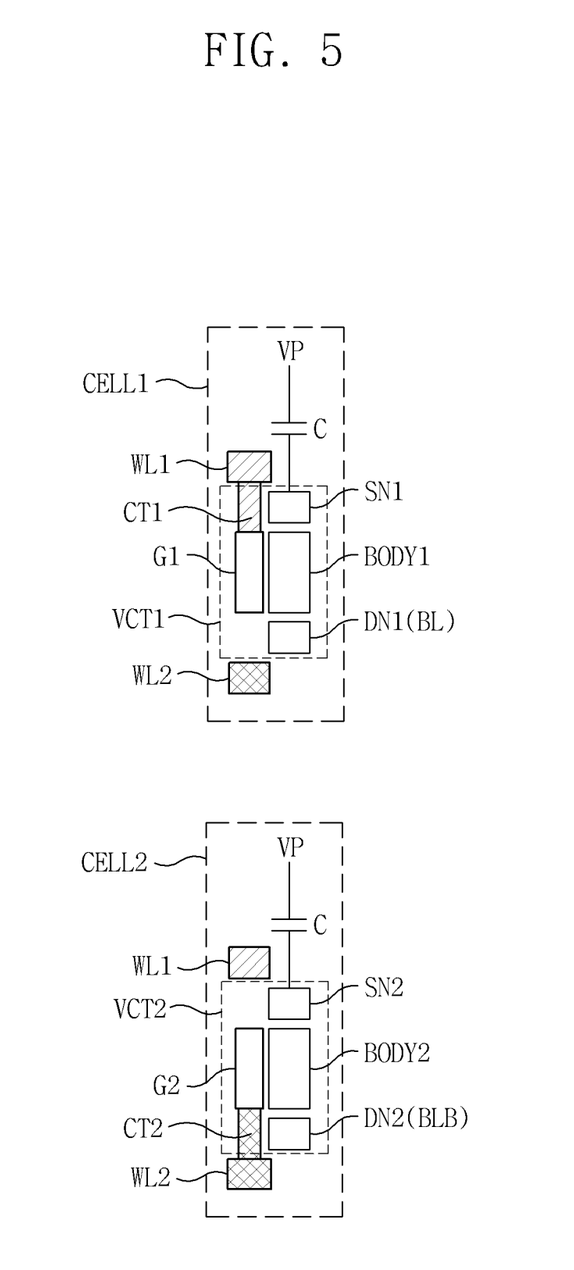
FIG. 5 is a cross-sectional view of an example embodiment of a vertical structure of one column of the memory array block included in the memory core of FIG. 2.
Figure 6:
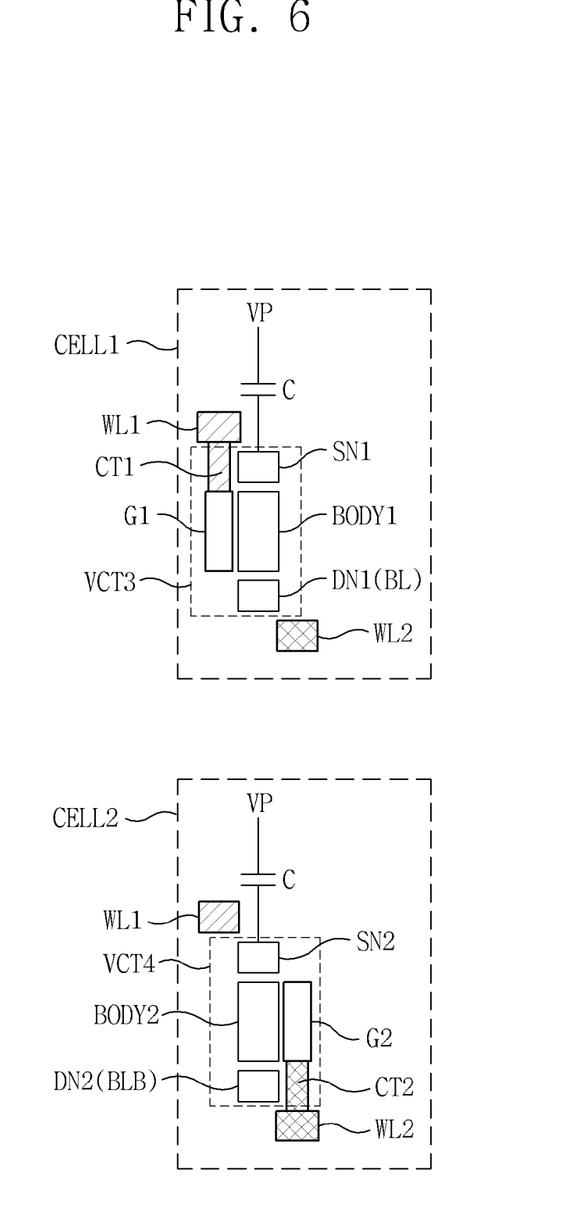
FIG. 6 is a cross-sectional view of another example embodiment of a vertical structure of one column of the memory array block included in the memory core of FIG. 2.

FIG. 5 is a cross-sectional view of an example embodiment of a vertical structure of one column of the memory array block included in the memory core of FIG. 2, and FIG. 6 is a cross-sectional view of another example embodiment of a vertical structure of one column of the memory array block included in the memory core of FIG. 2. FIG. 5 shows bodies BODY1 and BODY2, gates G1 and G2, upper active nodes (hereinafter referred to as sources) SN1 and SN2, and lower active nodes (hereinafter referred to as drains) DN1 and DN2 constituting cell transistors VCT1 and VCT2 included in memory cells CELL1 and CELL 2. In FIG. 5, the memory cell CELL1 includes a cell transistor VCT1 including a body BODY1, a source SN1, a drain DN1, and a gate G1. A shape of the body BODY1 may be a pillar type and the gate G1 may surround the body BODY1 between the source SN1 and drain DN1. In addition, memory cells CELL1 and CELL2 may include a contact CT1 and a contact CT2, respectively. The contact CT1 may contact the word line WL1 and the gate G1 and the contact CT2 may contact the word line WL2 and the gate G2. For example, the contact CT1 may be located at the left of the body BODY1 of the VCT1 and contact on the top surface of the gate G1. The contact CT2 may be located at the left of the body BODY2 of the VCT2 and contact on the bottom surface of the gate G2. In one embodiment, the word line WL1 may be disposed above the cell transistor VCT1, and the word line WL2 may be disposed below the cell transistor VCT2.

FIG. 6 shows bodies BODY1 and BODY2, gates G1 and G2, sources SN1 and SN2, and drains DN1 and DN2 constituting cell transistors VCT3 and VCT4 included in memory cells CELL1 and CELL 2. In addition, memory cells CELL1 and CELL2 may include a contact CT1 and a contact CT2, respectively. The contact CT1 may contact the word line WL1 and the gate G1 and the contact CT2 may contact the word line WL2 and the gate G2. For example, the contact CT1 may be located at the left of the body BODY1 of the VCT3 and contact on the top surface of the gate G1. The contact CT2 may be located at the right of the body BODY2 of the VCT4 and contact on the bottom surface of the gate G2. In one embodiment, the word line WL1 may be disposed above the cell transistor VCT3, and the word line WL2 may be disposed below the cell transistor VCT4. The contacts CT1 and CT2 described above may be formed of a conductive material connected to and contacting the respective gates and wordlines.

In FIGS. 5 and 6, a first bit line BL may be connected to the drains DN of the cell access transistors VCT1 and VCT3 connected with the first word line WL1, and a second bit line BLB may be connected to the drains DN of the cell access transistors VCT2 and VCT4 connected with the second word line WL2. The first bit line BL may be a normal bit line, and the second bit line BLB may be a complementary bit line.

Referring to FIGS. 3 and 5, in one embodiment, the gate G1 of the cell access transistor VCT1 included in the memory cell CELL1, and the gate G2 of the cell access transistor VCT2 included in the memory cell CELL2 are disposed to be aligned with each other. Also, the first word line WL1 and the second word line WL2 arranged in the first column COL1 of the memory array block 120a are disposed to be aligned with each other.

Referring to FIGS. 4 and 6, in one embodiment, the gate G1 of the cell access transistor VCT3 included in the memory cell CELL1, and the gate G2 of the cell access transistor VCT4 included in the memory cell CELL2 are disposed not to be aligned with each other but to be separated from each other by the bodies BODY1 and BODY2 of the cell transistors VCT3 and VCT4. Also, the first word line WL1 and the second word line WL2 arranged in the first column COL1 of the memory array block 120a are disposed to be separated from each other by the bodies BODY1 and BODY2 of the cell access transistors VCT3 and VCT4.

Referring to FIGS. 2 to 6, in one embodiment, the first word line WL1 arranged in the first column COL1 of the memory array block 120a is disposed above the upper portion of the cell access transistors VCT1 and VCT2 in a semiconductor integrated circuit (IC), and the second word line WL2 arranged in the first column COL1 of the memory array block 120a is disposed below the lower portion of the cell access transistors VCT1 and VCT2 in the semiconductor IC.

Referring to FIGS. 1 to 6, the memory core 100 includes the first memory array block 120, the second memory array block 140, and the bit-line sense amplifier 130.

The first memory array block 120 includes a plurality of rows and columns including first memory cells having first cell transistors, and each of the plurality of columns includes a first word line disposed above the upper portions of the first cell transistors, and a second word line disposed below the lower portions of the first cell access transistors. The second memory array block 140 includes a plurality of rows and columns including second memory cells having second cell transistors, and each of the plurality of columns includes a third word line disposed above the upper portions of the second cell access transistors, and a fourth word line disposed below the lower portions of the second cell access transistors. In addition, each column of memory cells includes a plurality of consecutive memory cells having a plurality of respective consecutive cell transistors that comprise at least a first group of cell transistors and a second group of cell transistors. The first word line is disposed above the plurality of respective consecutive cell transistors and electrically connected to the first group of cell transistors and the second word line is disposed below the plurality of respective consecutive cell transistors and electrically connected to the second group of cell transistors. For example, the cell transistors may be vertical channel transistors (VCTs) where the first group of cell transistors are even-numbered VCTs (i.e. $2^{nd}$, $4^{th}$, $6^{th}$, etc. VCTs when viewed in sequential order), and the second group of cell transistors are odd-numbered VCTs (i.e. $1^{st}$, $3^{rd}$, $5^{th}$, etc.)

The bit-line sense amplifier 130 amplifies a voltage difference between two neighboring bit lines arranged in the first memory array block 120, and between two neighboring bit lines arranged in the second memory array block 140.

Figure 7:
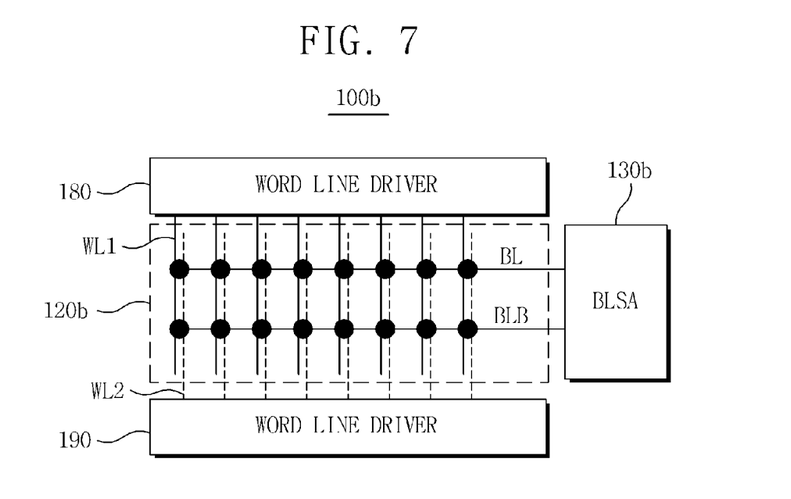
FIG. 7 is a plan view of a memory core according to another embodiment.

FIG. 7 is a plan view of a memory core 100b according to another embodiment.

Figure 8:
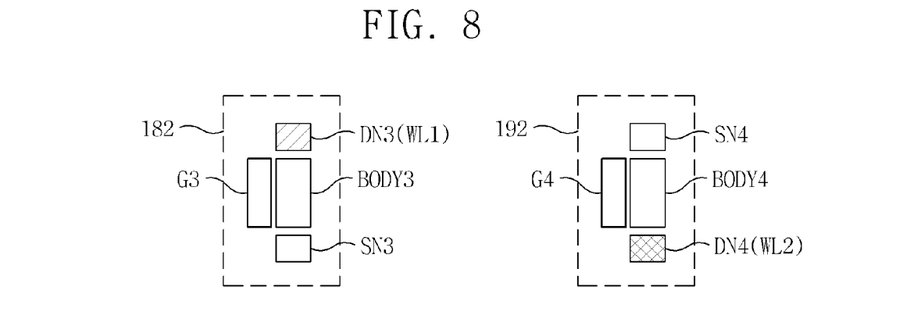
FIG. 8 is a cross-sectional view of an example embodiment of a vertical structure of driver transistors included in word line drivers included in the memory core of FIG. 7.

Referring to FIG. 7, the memory core 100b includes a memory array block 120b, a bit-line sense amplifier 130b, a first word line driver 180, and a second word line driver 190. FIG. 8 is a cross-sectional view of an example embodiment of a vertical structure of driver transistors included in the word line drivers 180 and 190 included in the memory core 100b of FIG. 7.

FIG. 8 shows a body BODY3, a gate G3, a source SN3 and a drain DN3 constituting a first driver transistor 182 included in the first word line driver 180, and a body BODY4, a gate G4, a source SN44 and a drain DN constituting a second driver transistor 192 included in the second word line driver 190. For example, the first driver transistor 182 and second driver transistor 192 may be vertical channel transistors VCTs. A first word line WL1 is electrically connected to the drain DN3 of the first driver transistor 182, and the gate G1 of the cell transistor (VCT1 of FIG. 5) may be connected to the drain DN3 of the first driver transistor 182. A second word line WL2 is connected to the drain DN4 of the second driver transistor 192, and the gate G2 of the cell access transistor (VCT2 of FIG. 5) may be connected to the drain DN4 of the second driver transistor 192.

In the memory core 100b having the structure of FIG. 7, memory array blocks may be disposed to the left and right of the bit-line sense amplifier 130b when viewed from on overhead view. A first memory array block may be disposed to the left of the bit-line sense amplifier 130b, and a second memory array block may be disposed to the right of the bit-line sense amplifier 130b when viewed from on overhead view.

Also, the memory core 100b may further include first to fourth word line drivers. The first and second word lines are arranged in the first memory array block, and the third and fourth word lines are arranged in the second memory array block.

The first word line driver is disposed to the top of the first memory array block when viewed from on overhead view, and drives the first word line. The second word line driver is disposed to the bottom of the first memory array block when viewed from on overhead view, and drives the second word line. The third word line driver is disposed to the top of the second memory array block when viewed from on overhead view, and drives the third word line. The fourth word line driver is disposed to the bottom of the second memory array block when viewed from on overhead view, and drives the fourth word line.

Figure 9:
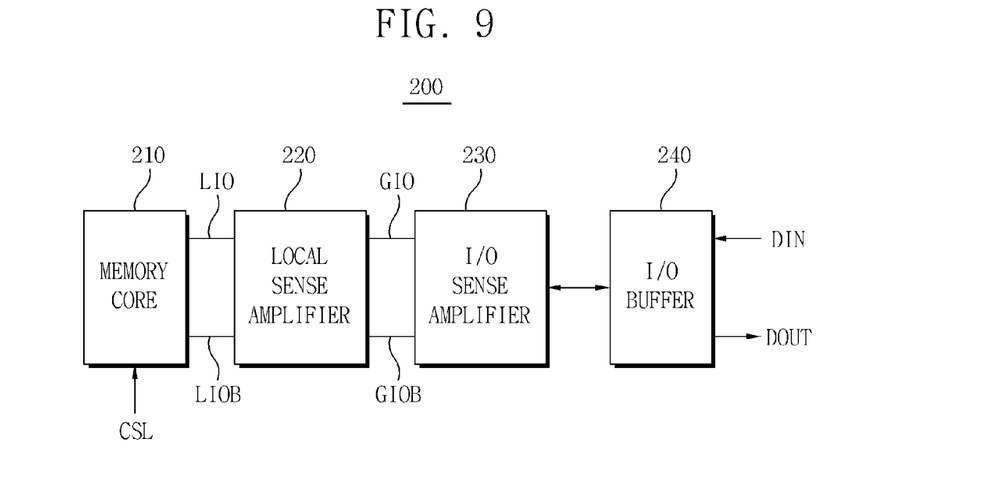
FIG. 9 is a block diagram of a semiconductor memory device including a memory core according to described embodiments.

FIG. 9 is a block diagram of an example of a semiconductor memory device 200 including the memory core 100 according to above described embodiments.

Referring to FIG. 9, the semiconductor memory device 200 includes a memory core 210, a local sense amplifier 220, an input/output (I/O) sense amplifier 230, and an I/O buffer 240. The semiconductor memory device 200 may include, for example, DRAM (including DDR and SDRAM), NAND flash, NOR flash, RRAM, PRAM, MRAM etc., and may be part of a semiconductor chip, a package including a semiconductor chip, a package-on-package device, a semiconductor memory module, etc.

The memory core 210 amplifies a voltage difference between a bit line BL and a complementary bit line BLB, and provides the amplified voltage difference to a pair of local I/O lines LIO and LIOB. The local sense amplifier 220 amplifies a voltage signal of the pair of local I/O lines LIO and LIOB, and provides the amplified voltage signal to a pair of global I/O lines GIO and GIOB. The I/O sense amplifier 230 amplifies a voltage signal of the pair of global I/O lines GIO and GIOB. An output signal DOUT of the I/O buffer 240 is output to the outside of the semiconductor memory device 200 through an output pad (not shown).

The memory core 210 included in the semiconductor memory device 200 may have a constitution of the memory core 100 according to above described embodiments. The memory core 210 includes a memory array block and a bit-line sense amplifier.

The memory array block includes a plurality of rows and columns including memory cells having cell access transistors, and each of the plurality of columns includes a first word line disposed above the upper portions of the cell transistors, and a second word line disposed below the lower portions of the cell access transistors. The bit-line sense amplifier amplifies a voltage difference between two neighboring bit lines arranged in the memory array block. The cell transistors of memory cells included in each column of the memory array block may be alternately coupled with bit lines. The cell transistors may be VCTs.

A memory core according to certain disclosed embodiments has a folded bit-line structure but operates as having an open bit-line structure. In the memory core, a sense amplifier does not occupy a large area in a bit-line direction, and neither a dummy bit line nor an edge block is present. Accordingly, a semiconductor memory device including the memory core according to above described embodiments can be disposed in a small area in an IC and has excellent noise characteristics.

The example embodiments can be applied to a semiconductor memory device, and a memory module or a memory system including the semiconductor memory device.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and not to be construed as limiting of the inventive concept to the specific embodiments disclosed, and that modifications to the disclosed embodiments, as well as other embodiments, are intended to be included within the scope of the appended claims.

What is claimed is:

1. A semiconductor memory device, comprising:
   a memory array block including:
   a first set of memory cells electrically connected to a first bit line extending in a first direction;
   a second set of memory cells electrically connected to a second bit line extending in the first direction and adjacent to the first bit line;
   a first word line electrically connected to a first memory cell of the first set of memory cells and extending in a second direction perpendicular to both the first direction and a vertical direction; and a second word line electrically connected to a first memory cell of the second set of memory cells and extending in the second direction, wherein each memory cell of the first set of memory cells includes a respective first cell transistor having an upper active node, a lower active node and a gate node disposed between the upper active node and the lower active node, wherein the gate node includes top surface and bottom surface, and wherein the first word line is disposed vertically above the top surface of the gate node of each of the first cell transistors and the second word line is disposed vertically below the bottom surface of the gate node of each of the first cell transistors, a bit-line sense amplifier configured to amplify a voltage difference between the first bit line and second bit line.

2. The semiconductor memory device of claim 1, wherein each first cell transistor is a vertical channel transistor (VCT).

3. The semiconductor memory device of claim 2, wherein each vertical channel transistor further includes a body disposed between the upper active node and lower active node, wherein the gate node surrounds the body.

4. The semiconductor memory device of claim 3, wherein the first word line and the second word line are disposed to be separated from each other by bodies of the first cell transistors.

5. The semiconductor memory device of claim 3, wherein the upper active node is a source node and the lower active node is a drain node.

6. The semiconductor memory device of claim 5, wherein the first word line connects to the top surface of the gate node of the first cell transistor of the first memory cell of the first set of memory cells.

7. The semiconductor memory device of claim 6, wherein the first word line and the gate node of the first cell transistor of the first memory cell of the first set of memory cells are electrically connected at the left of the body of the first cell transistor of the first memory cell of the first set of memory cells.

8. The semiconductor memory device of claim 7, wherein the second word line electrically connects to the bottom surface of the gate node of the first cell transistor of the first memory cell of the second set of memory cells.

9. The semiconductor memory device of claim 8, wherein the second word line and the gate node of the first cell transistor of the first memory cell of the second set of memory cells are electrically connected at either the left or the right of the body of the first cell transistor of the first memory cell of the second set of memory cells.

10. The semiconductor memory device of claim 9, wherein each crossing of the first word line with a bit line in the first memory array block coincides with a cell transistor.

11. The semiconductor memory device of claim 1, wherein the memory array block is a first memory array block, and further comprising a second memory array block disposed to the right of the bit-line sense amplifier when viewed from on overhead view, wherein the first memory array block is disposed to the left of the bit-line sense amplifier, when viewed from on overhead view.

12. The semiconductor memory device of claim 1, further comprising:

a first word line driver disposed to the top of the first memory array block when viewed from on overhead view, and configured to drive the first word line; and a second word line driver disposed to the bottom of the first memory array block when viewed from on overhead view, and configured to drive the second word line.

13. The semiconductor memory device of claim 12, wherein the first word line driver includes a first vertical channel transistor having an upper active node, a lower active node and a gate node disposed between the upper active node and the lower active node, the upper active node of the first vertical channel transistor is electrically connected to the first word line; and wherein the second word line driver includes a second vertical channel transistor having an upper active node, a lower active node and a gate node disposed between the upper active node and the lower active node, the lower active node of the second vertical channel transistor is electrically connected to the second word line.

14. A semiconductor memory device, comprising:

a first memory array block including a first plurality of rows and columns including memory cells having first cell transistors, each row of the first plurality of rows including a first word line extending in a first direction perpendicular to a vertical direction and arranged verticality above upper portions of the first cell transistors, and a second word line extending in the first direction arranged vertically below lower portion of the first cell transistors, wherein the first plurality of columns include a first bit line and a complementary first bit line both extending in a second direction perpendicular to the first direction;

a second memory array block including a second plurality of rows and columns including memory cells having second cell transistors, each row of the second plurality of rows including a third word line extending in the first direction and arranged vertically above upper portions of the second cell transistors, and a fourth word line extending in the first direction and arranged vertically below lower portions of the second cell transistors, wherein the second plurality of columns include a second bit line and a complementary second bit line both extending in the second direction; and a bit-line sense amplifier configured to amplify a voltage difference between the first bit line and the complementary first bit line arranged in the first memory array block, and a voltage difference between the second bit line and the complementary second bit line arranged in the second memory array block, wherein each crossing of the first word line with a bit line in the first memory array block coincides with a first cell transistor, and each crossing of the third word line with a bit line in the second memory array block coincides with a second cell transistor wherein each crossing of the first word line or the third word line with a complementary bit line does not coincide with a cell transistor.

15. The semiconductor memory device of claim 14, wherein the first and second cell transistors are vertical channel transistors (VCTs).

16. The semiconductor memory device of claim 15, wherein each of the vertical channel transistors includes a gate node, an upper active node, a lower active node and a body disposed between the upper active node and lower active node, wherein the gate node surrounds the body.

17. The semiconductor memory device of claim 16, wherein each of the upper portions of the first cell transistors is located above the each of the gate nodes of the first cell transistors, and each of the lower portions of the first cell transistors is located below the each of the gate nodes of the first cell transistors.

18. The semiconductor memory device of claim 17, wherein the first memory array block is disposed to the left of the bit-line sense amplifier when viewed from on overhead view, and the second memory array block is disposed to the right of the bit-line sense amplifier when viewed from on overhead view.

* * * * *